United States Patent [19]
Miura et al.

[11] Patent Number: 5,066,993
[45] Date of Patent: Nov. 19, 1991

[54] SEMICONDUCTOR DEVICE HAVING SEMICONDUCTOR-ON-INSULATOR STRUCTURE

[75] Inventors: Takao Miura, Tokyo; Kazunori Imaoka, Komae, both of Japan

[73] Assignee: Fujitsu Limited, Kawasaki, Japan

[21] Appl. No.: 447,524

[22] Filed: Dec. 7, 1989

[30] Foreign Application Priority Data

Dec. 8, 1988 [JP] Japan .................. 63-310458

[51] Int. Cl.$^5$ ............................ H01L 29/78
[52] U.S. Cl. .......................... 357/23.7; 357/2; 357/4; 357/23.45
[58] Field of Search ............ 357/23.7, 23.15, 2, 357/4

[56] References Cited

U.S. PATENT DOCUMENTS

| | | | |
|---|---|---|---|
| 4,297,782 | 11/1981 | Ito | 350/23.15 |
| 4,758,529 | 7/1988 | Ipri | 357/23.7 |
| 4,778,773 | 10/1988 | Sukegawa | 357/23.7 |
| 4,788,157 | 11/1988 | Nakamura | 357/23.7 |
| 4,810,664 | 3/1989 | Kamins et al. | 357/23.7 |
| 4,864,377 | 9/1989 | Widdershoven | 357/23.7 |
| 4,880,753 | 11/1989 | Meakin et al. | 357/23.7 |

FOREIGN PATENT DOCUMENTS 26570 3/1969 Japan .
186612 8/1989 Japan .

OTHER PUBLICATIONS

Wang et al., "The Effect of Ion Implantation on Oxide Charge in MOS Devices", IEEE Transactions on Nuclear Science, vol. NS-22, No. 6, Dec. 1975 Merely Relates to Studies on Electron Traps Introduced into the Oxide by Implantation of Al+ions.
Curtis, Jr., et al., "Physical Mechanisms of Radiation Hardening of MOS Devices by Ion Implantation", IEEE Transactions on Nuclear Science, vol. NS-22, No. 6, Dec. 1975 Simply Relates to Studies on Al-+Ion-Implanted MOS Capacitors.
DiMaria et al., "Location of Trapped Charge in Aluminium-Implanted SiO$_2$", IBM J. Res. Develop. vol. 22, No. 3, May 1978.
Young et al., "Characterization of Electron Traps in Aluminum-Implanted SiO$_2$", IBM J. Res. Develop. vol. 22, No. 3, May 1978 Merely Relate to Studies on Electron Trapping Behavior of SiO$_2$ Implanted with Al.
Lasky et al., "Silicon-On-Insulator (SOI) by Bonding and Etch-Back", IEDM 85, pp. 684-687 1985.
Hamaguchi et al., "Novel LSI/SOI Wafer Fabrication Using Device Layer Transfer Technique", IEDM 85, pp. 688-691 1985 Simply Relate to Studies on SOI Structions.

Primary Examiner—Rolf Hille
Assistant Examiner—Tan Ho
Attorney, Agent, or Firm—Staas & Halsey

[57] ABSTRACT

A method of producing a semiconductor-on-insulator structure generates a first fixed charge in an insulator layer of a base substrate. An active substrate which is made of a semiconductor is bonded on the insulator layer of the base substrate to thereby generate a second fixed charge at an interface of the insulator layer and the active substrate. The first and second fixed charges have mutually opposite polarities. A portion of the active substrate is removed to form the active substrate to an arbitrary thickness.

8 Claims, 9 Drawing Sheets

SEMICONDUCTOR DEVICE HAVING SEMICONDUCTOR-ON-INSULATOR STRUCTURE

BACKGROUND OF THE INVENTION

The present invention generally relates to methods of producing semiconductor-on-insulator structures and semiconductor devices having the semiconductor-on-insulator structure, and more particularly to a method of producing a semiconductor-on-insulator structure such as a silicon-on-insulator (SOI) structure and a semiconductor device having such a semiconductor-on-insulator structure.

The SOI technology was proposed as a method of forming an insulator layer between two single crystal semiconductor layers for the purpose of producing high-speed elements and semiconductor devices which are uneasily affected by alpha-rays. As methods of producing the SOI structure, there are the silicon on sapphire (SOS) technique, the laser melt technique, the wafer bonding technique and the like. However, according to the SOS technique and the laser melt technique, it is difficult to form a perfect single crystal layer on the insulator layer. For this reason, there is much attention on the wafer bonding technique.

Figure 1A:
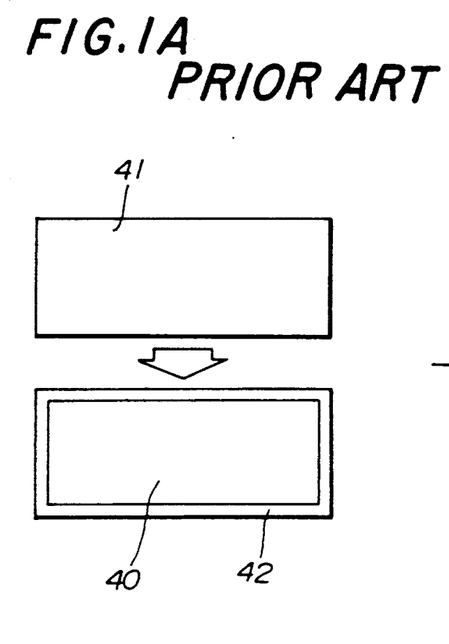
FIGS. 1A and 1B are cross sectional views for explaining a conventional bonding technique.
Figure 1B:
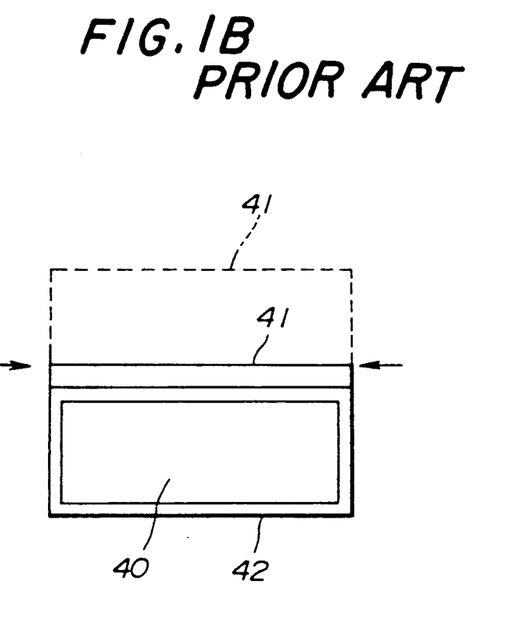

FIGS. 1A and 1B are diagrams for explaining a conventional bonding technique. As shown in FIG. 1A, the surface of one of a base substrate 40 and an active substrate 41 is covered by a silicon dioxide ($SiO_2$) layer 42. In this example, the $SiO_2$ layer 42 covers the base substrate 40. The active substrate 41 is bonded on the base substrate 40 having the $SiO_2$ layer 42 as indicated by an arrow. Thereafter, the active substrate 41 is subjected to lapping and polishing processes so as to remove a portion of the active substrate 41 indicated by a phantom line in FIG. 1B. As a result, the remaining active substrate 41 on the $SiO_2$ layer 42 of the base substrate 40 has a thickness of approximately 5 microns.

Figure 2:
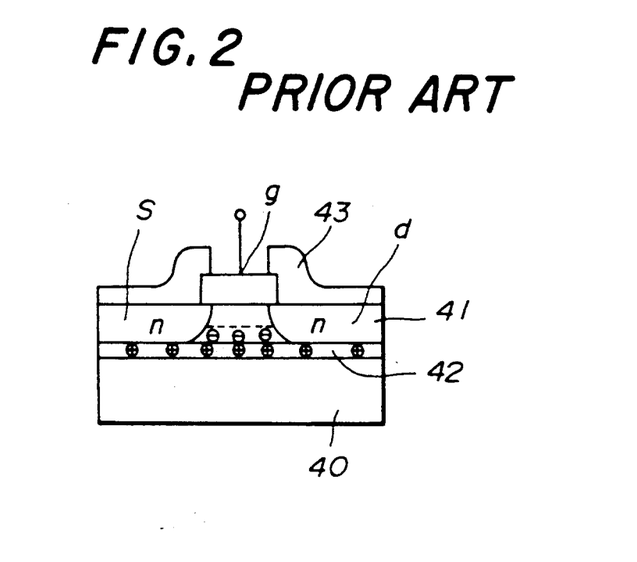
FIG. 2 is a cross sectional view showing an example of a MOSFET which uses the SOI structure shown in FIG. 1B.

When using the SOI structure shown in FIG. 1B to make a metal oxide semiconductor field effect transistor (MOSFET), a gate electrode g of the MOSFET is formed on the base substrate 40 via an insulator layer 43 as shown in FIG. 2. Then, two n-type regions are formed in the active substrate 41 to form a source s and a drain d of the MOSFET.

But molecules which lack oxygen such as SiO and $Si_2O_3$ molecules exist within the $SiO_2$ layer 42 which is provided between the base substrate 40 and the active substrate 41. For this reason, a positive interface state occurs at the $SiO_2$ interface, and an inversion and a depletion state easily occur at the interface on the side of the active substrate 41. When such inversion and depletion state occur, an electron transition naturally occurs between the source s and the drain d of the MOSFET and causes an erroneous operation of the MOSFET.

In order to prevent the above described erroneous operation of the MOSFET, it is necessary to prevent the inversion and depletion state from occurring in the $SiO_2$ layer 42.

Figure 3:
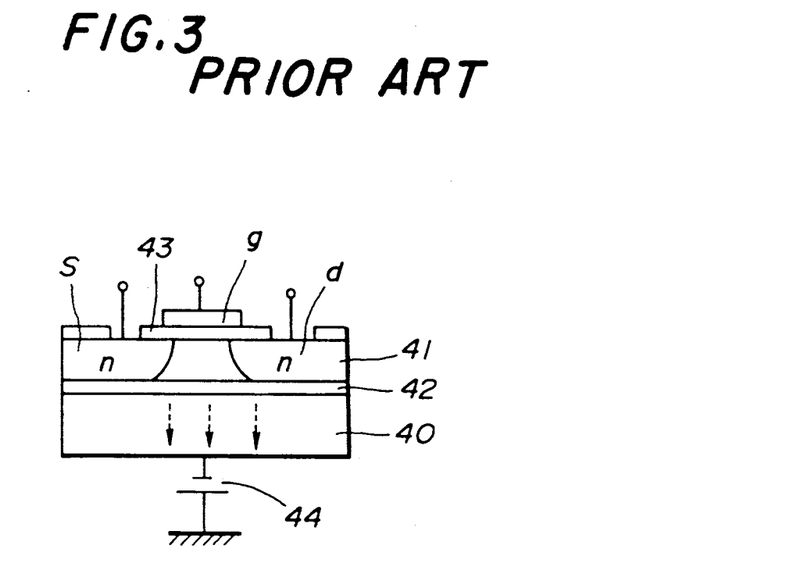
FIG. 3 is a cross sectional view for explaining one conventional method of preventing the inversion and depletion state from occurring in a $SiO_2$ layer.

FIG. 3 shows one conventional method of preventing the inversion and depletion state from occurring in the $SiO_2$ layer 42. In FIG. 3, a negative voltage is applied to the base substrate 40 from a voltage source 44.

Figure 4:
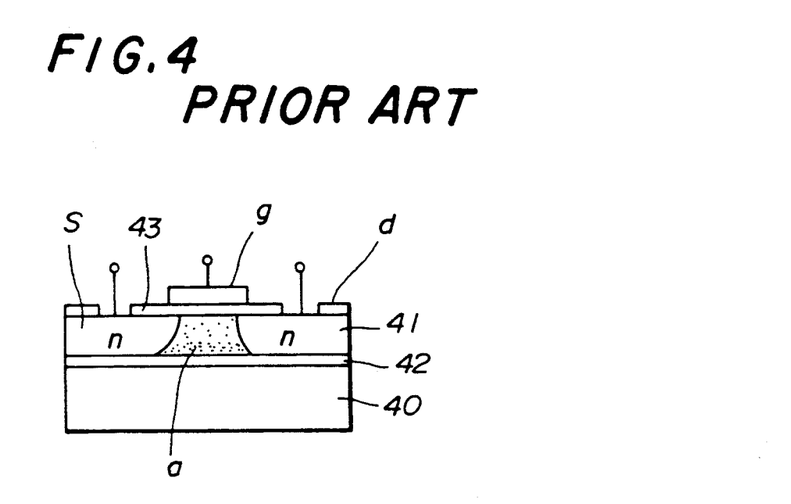
FIG. 4 is a cross sectional view for explaining another conventional method of preventing the inversion and depletion state from occurring in a $SiO_2$ layer.

FIG. 4 shows another conventional method of preventing the inversion and depletion state from occurring in the $SiO_2$ layer 42. In FIG. 4, a p-type impurity a such as boron (B) is injected into the interface on the side of the active substrate 41, so as to prevent the generation of negative charges in the active substrate 41.

However, according to the method shown in FIG. 3, there is a problem in that a control device for controlling the semiconductor device becomes bulky and complex because of the need to add the voltage source 44 for applying the negative voltage to the base substrate 40. For example, in the case of a complementary metal oxide semiconductor (CMOS) device, there is a need to provide two bias voltages for the p-channel n-channel transistors.

On the other hand, according to the method shown in FIG. 4, there is a problem in that it is difficult to adjust a threshold voltage of the MOSFET due to the injected impurity ions. In addition, there is also a problem in that the p-type impurity a diffuses into the active substrate 41 and varies the threshold voltage of the gate g when a thermal process is carried out to form elements on the active substrate 41. Hence, it is virtually impossible to make an active substrate which is sufficiently thin and does not contain the diffused p-type impurity a.

Figure 5A:
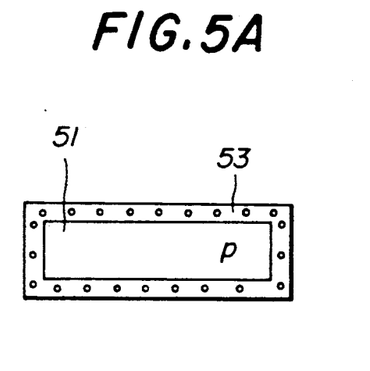
FIGS. 5A through 5E are cross sectional views for explaining a proposed method of forming a SOI structure.
Figure 5B:
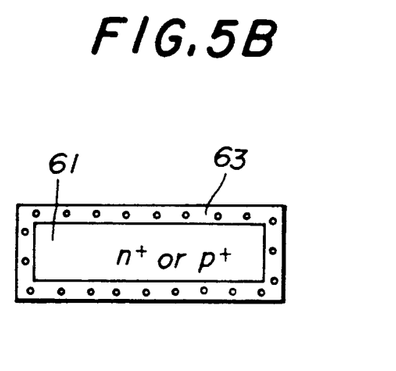
Figure 5C:
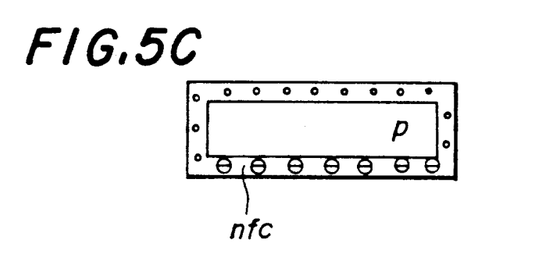
Figure 5D:
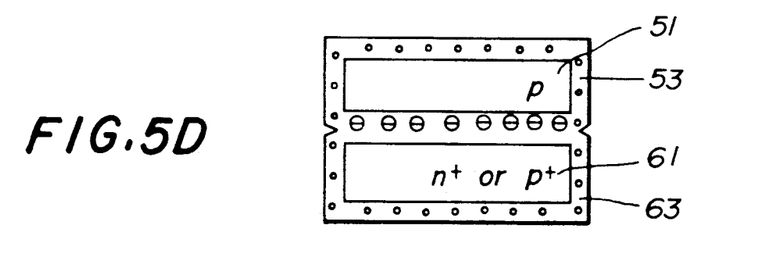
Figure 5E:
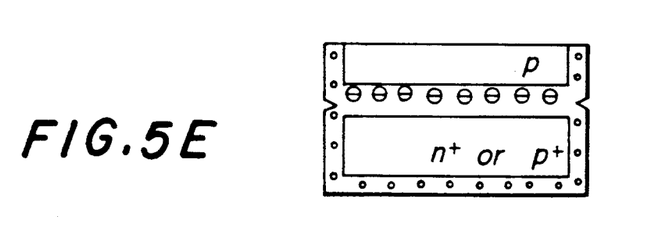

In order to eliminate the above described problems, a bonding method was proposed in a Japanese Laid-Open Patent Application No. 1-186612. According to this proposed method, the SOI structure is formed as shown in FIGS. 5A through 5E. The surface of an active substrate 51 is covered by a $SiO_2$ layer 53 as shown in FIG. 5A. On the other hand, the surface of a base substrate 61 is covered by a $SiO_2$ layer 63 as shown in FIG. 5B. The thickness of the $SiO_2$ layer 63 is greater than that of the $SiO_2$ layer 53. A negative fixed charge nfc is formed in the $SiO_2$ layer 53 by injecting aluminum (Al) ions or the like as shown in FIG. 5C. Then, as shown in FIG. 5D, the active substrate 51 and the base substrate 61 are bonded together so that the $SiO_2$ layer 63 of the base substrate 61 makes contact with the $SiO_2$ layer 53 which has the negative fixed charge nfc. As a result, the positive charge within the $SiO_2$ layer 53 is eliminated. The structure shown in FIG. 5D is then formed into the structure shown in FIG. 5E by polishing the top portion of the active substrate 51.

But according to this proposed method, the $SiO_2$ layer 53 is formed on the active substrate 51 by a thermal oxidation, and the formed $SiO_2$ layer 53 only has a thickness in the range of 0.4 micron to 1.0 micron. For this reason, when the Al ions are injected into the $SiO_2$ layer 53 at a high energy, the Al ions easily penetrate the $SiO_2$ layer 53 and reach the active substrate 51. When the Al ions are injected into the active substrate 51, there are problems in that the characteristics of elements such as transistors formed on the active substrate 51 change and the performance of the semiconductor device becomes poor. These problems become notable especially when the active substrate 51 is made thin since a large portion of the active substrate 51 is damaged by the Al ions which penetrated the $SiO_2$ layer 53.

In order to prevent the Al ions from penetrating the $SiO_2$ layer 53, it is possible to consider reducing the energy at which the Al ions are injected. To prevent the penetration of the Al ions, the energy must be reduced to 10 keV or less, but at such a small energy the injection coefficient becomes greatly reduced and it becomes difficult to adjust the ion injection quantity.

SUMMARY OF THE INVENTION

Accordingly, it is a general object of the present invention to provide a novel and useful method of producing a semiconductor-on-insulator structure and a semiconductor device having such a semiconductor-on-insulator structure, in which the problems described above are eliminated.

Another and more specific object of the present invention is to provide a method of producing a semiconductor-on-insulator structure comprising the steps of generating a first fixed charge in an insulator layer of a base substrate, bonding an active substrate which is made of a semiconductor on the insulator layer of the base substrate, thereby generating a second fixed charge at an interface of the insulator layer and the active substrate, where the first and second fixed charges have mutually opposite polarities, and removing a portion of the active substrate to form the active substrate to an arbitrary thickness. According to the method of the present invention, it is possible to effectively prevent the back channel and provide an active substrate which can be used to form elements which have designed characteristics. Further, the bonding strength between the active substrate and the insulator layer is large and extremely satisfactory.

Still another object of the present invention is to provide a method of producing a semiconductor-on-insulator structure comprising the steps of generating a first fixed charge in a first insulator layer of a base substrate, bonding an active substrate which is made of a semiconductor and has a second insulator layer on the base substrate so that the first and second insulator layers make contact with each other, thereby generating a second fixed charge at an interface of the second insulator layer and the active substrate, where the first and second fixed charges having mutually opposite polarities, and removing a portion of at least the active substrate to form the active substrate to an arbitrary thickness. According to the method of the present invention, it is possible to effectively prevent the back channel and provide an active substrate which can be used to form elements which have designed characteristics.

A further object of the present invention is to provide a semiconductor-on-insulator structure comprising a base substrate having an insulator layer at least on a surface portion thereof, where the insulator layer includes impurities which are distributed with a predetermined density distribution in which an impurity density is dependent on a distance from a surface of the insulator layer and having a first fixed charge and a surface portion of the insulator layer has an impurity density which corresponds approximately to a maximum impurity density in the predetermined density distribution, an active substrate which is made of a semiconductor and is bonded on the insulator layer of the base substrate, thereby generating a second fixed charge at an interface of the insulator layer and the active substrate, where the first and second fixed charges have mutually opposite polarities. According to the semiconductor-on-insulator structure of the present invention, it is possible to effectively prevent the back channel and provide an active substrate which can be used to form elements which have designed characteristics. Further, the bonding strength between the active substrate and the insulator layer is large and extremely satisfactory.

Another object of the present invention is to provide a semiconductor-on-insulator structure comprising a base substrate having a first insulator layer at least on a surface portion thereof, where the first insulator layer includes impurities which are distributed with a predetermined density distribution in which an impurity density is dependent on a distance from a surface of the first insulator layer and having a first fixed charge and a surface portion of the first insulator layer has an impurity density which corresponds approximately to a maximum impurity density in the predetermined density distribution, an active substrate which is made of a semiconductor and having a second insulator layer, where the active substrate is bonded on the base substrate so that the first and second insulator layers make contact with each other, thereby generating a second fixed charge at an interface of the second insulator layer and the active substrate, and the first and second fixed charges have mutually opposite polarities. According to the semiconductor-on-insulator structure of the present invention, it is possible to effectively prevent the back channel and provide an active substrate which can be used to form elements which have designed characteristics.

Other objects and further features of the present invention will be apparent from the following detailed description when read in conjunction with the accompanying drawings.

DESCRIPTION OF THE PREFERRED EMBODIMENTS

Figure 6A:
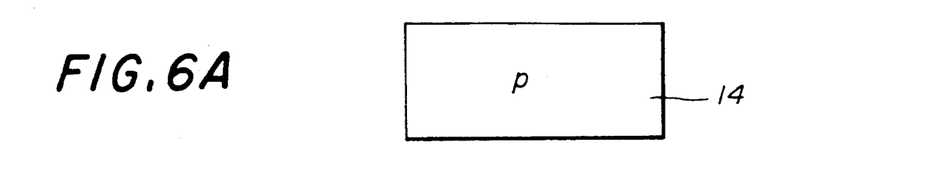
FIGS. 6A through 6F are cross sectional views for explaining a first embodiment of a method of producing a semiconductor-on-insulator structure according to the present invention.
Figure 6B:
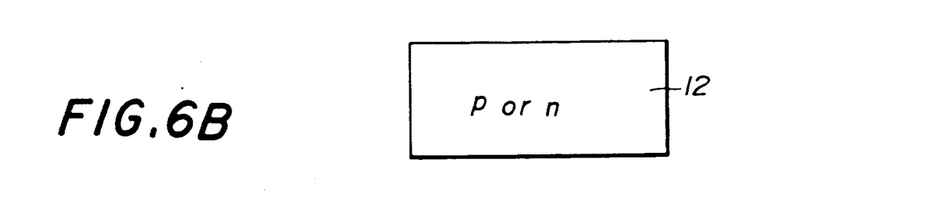
Figure 6C:
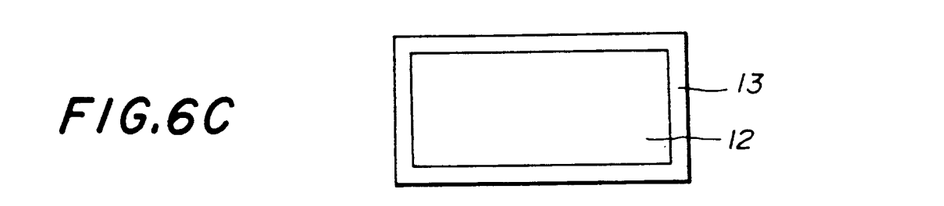

A description will be given of a first embodiment of the method of producing a semiconductor-on-insulator structure according to the present invention, by referring to FIGS. 6A through 6F. FIG. 6A shows an active substrate 14 which is made of a p-type silicon (Si), and FIG. 6B shows a base substrate 12 which is made of a p-type or n-type Si. The base substrate 12 is subjected to a thermal oxidation to form a SiO$_2$ layer 13 on the surface of the base substrate 12 as shown in FIG. 6C. For example, the SiO$_2$ layer 13 has a thickness in the range of 0.5 micron to 2.0 microns.

Figure 6D:
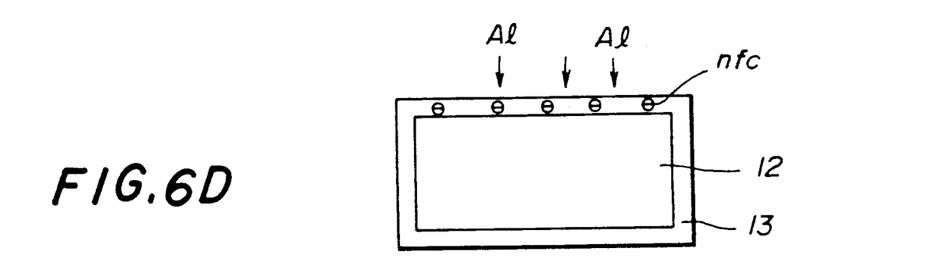
Figure 6E:
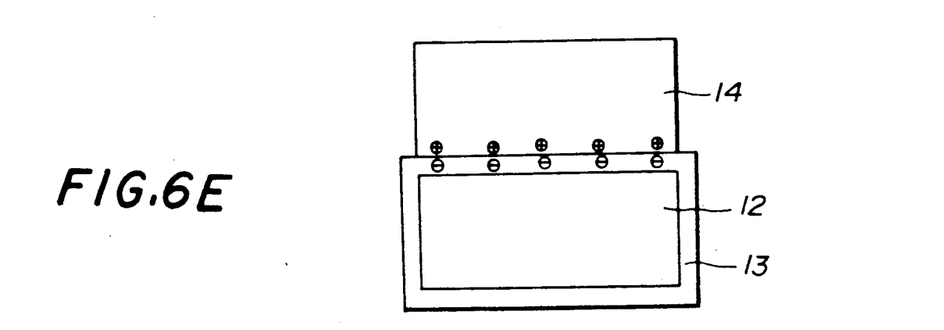
Figure 6F:
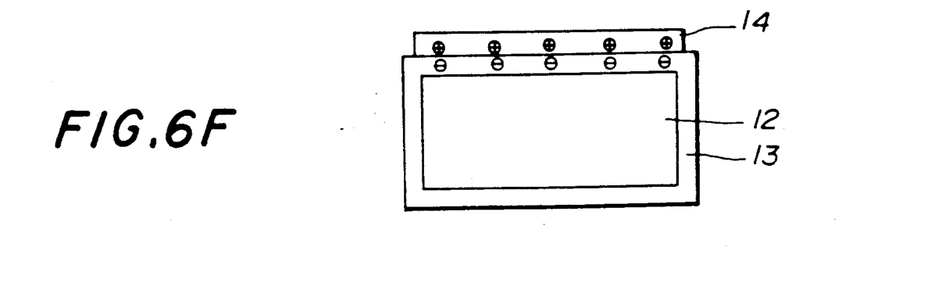

Next, aluminum (Al) ions are injected on one surface of the SiO$_2$ layer 13 as shown in FIG. 6D so as to generate a negative fixed charge nfc within the SiO$_2$ layer 13. The active substrate 14 is then bonded onto the base substrate 12 so that the surface of the active substrate 14 makes contact with the SiO$_2$ layer 13 which has the negative fixed charge nfc as shown in FIG. 6E. Thereafter, the active substrate 14 is polished to a desired thickness as shown in FIG. 6F. For example, the desired thickness is in the range of 0.1 micron to 10 microns.

In FIG. 6F, the positive charge is generated at the interface between the active substrate 14 and the SiO$_2$ layer 13, because no Al ions diffuse into the active substrate 14. As a result, the inversion and depletion state are prevented from occurring at the interface of the active substrate 14 and the SiO$_2$ layer 13. The effect of preventing a back channel is large because there is no SiO$_2$ layer covering the active substrate 14 which would affect the field of the SiO$_2$ layer 13.

Figure 7:
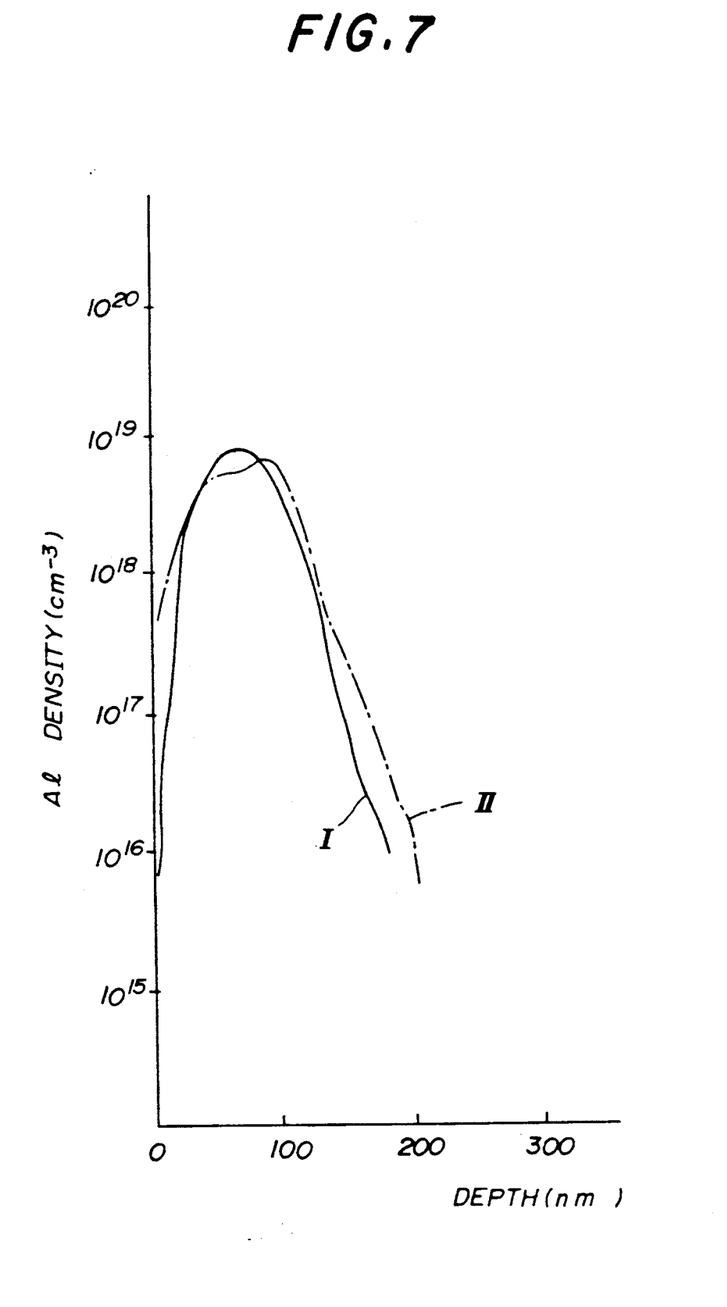
FIG. 7 is a graph for explaining diffusion of Al in a $SiO_2$ layer.

FIG. 7 shows a graph for explaining diffusion of Al in the SiO$_2$ layer 13. In FIG. 7, the ordinate indicates the Al density and the abscissa indicates the depth of the SiO$_2$ layer 13 by taking the surface of the SiO$_2$ layer 13 which makes contact with the active substrate 14 as zero depth. A curve I is obtained by Al ion implantation to the SiO$_2$ layer 13 which has a thickness of 400 nm at an injection energy of 90 keV, an injection density of $1 \times 10^{15}$ cm$^{-2}$ and an injection angle of 7°. A curve II is obtained after an annealing step which is carried out in an nitrogen (N$_2$) gas at 1050° C. for 600 minutes. As may be seen from FIG. 7, the curves I and II and approximately the same, and it is confirmed that the Al ions within the SiO$_2$ layer 13 do not diffuse into the active substrate 14 even after the annealing step is carried out.

Figure 8A:
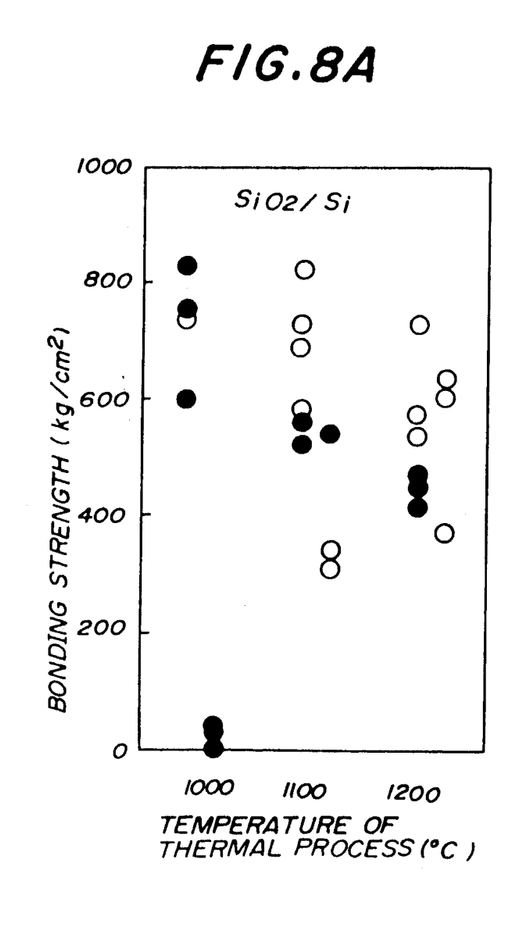
FIGS. 8A through 8C show data for explaining bonding states of $SiO_2/Si$, $Si/Si$ and $SiO_2/SiO_2$, respectively.

The active substrate 14 is bonded onto the SiO$_2$ layer 13 by a thermal process. FIG. 8A shows a bonding strength between a SiO$_2$ layer and the Si layer. The data is obtained for the SiO$_2$ layer which has a thickness of 500 nm and the thermal process is carried out in a N$_2$ gas for 2 hours. A first sample is made up of a Si substrate and a SiO$_2$ layer formed on one surface of the Si substrate. A second sample is made up of a Si substrate. The first and second samples are bonded so that the SiO$_2$ layer of the first sample makes contact with one surface (Si layer) of the second sample. The data is obtained by fixing the free (Si) surface of the first sample on a first base by an epoxy adhesive agent, fixing the free (Si) surface of the second sample on a second base by an epoxy adhesive agent, and pulling at least one of the first and second bases so as to separate them from each other. The black circular marks indicate a separation which occurs at the interface of the SiO$_2$ layer and the Si layer, and white circular marks indicate a separation which occurs at the interface of the Si layer and the epoxy adhesive agent.

Figure 8B:
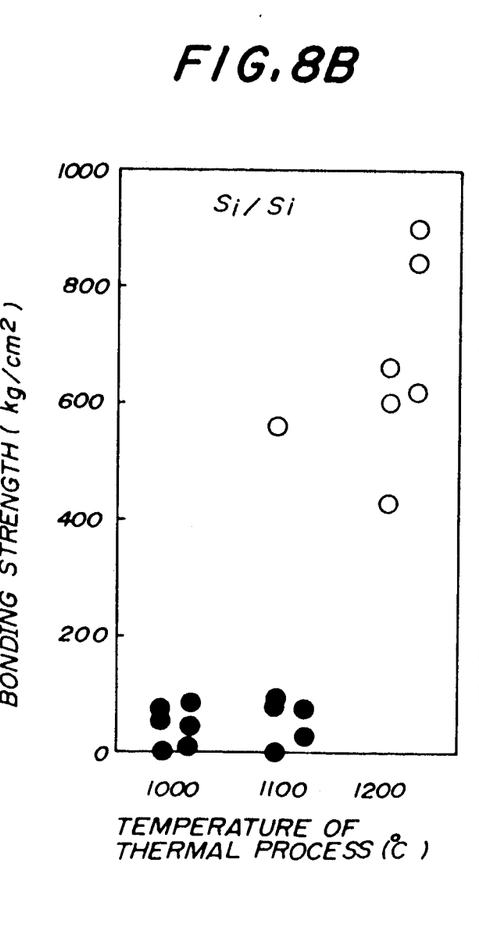
Figure 8C:
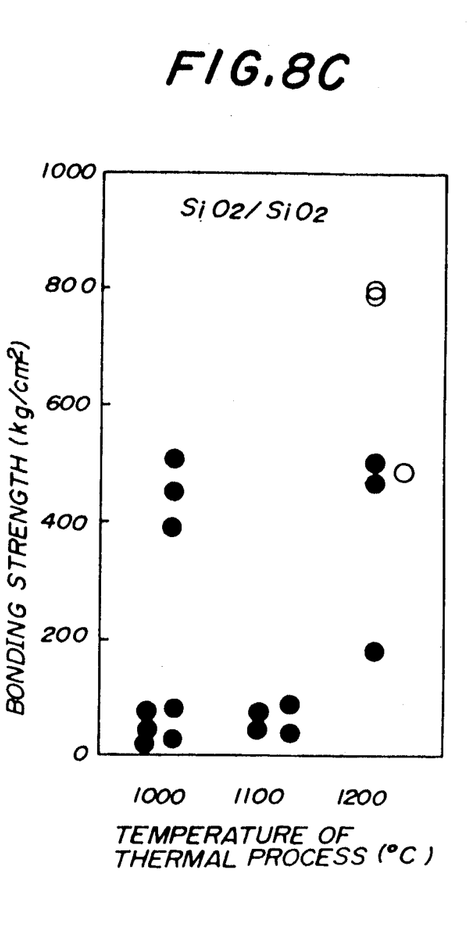

FIG. 8B shows a bonding strength between a Si layer and a Si layer, and FIG. 8C shows a bonding strength between a SiO$_2$ layer and a SiO$_2$ layer. The data shown in FIGS. 8B and 8C are obtained under the same conditions as in FIG. 8A. Although the bonding strength between the two Si layers is small and unsatisfactory, it can be seen that the bonding strength is sufficiently large for the cases shown in FIGS. 8A and 8C and very large in the case shown in FIG. 8A.

Next, a description will be given of a second embodiment of the method of producing the semiconductor-on-insulator structure according to the present invention, by referring to FIGS. 9A through 9E. In FIGS. 9A through 9E, those parts which are essentially the same as those corresponding parts in FIGS. 6A through 6F are designated by the same reference numerals.

Figure 9A:
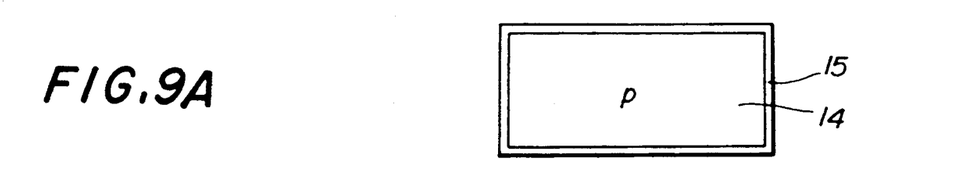
FIGS. 9A through 9E are cross sectional views for explaining a second embodiment of the method of producing a semiconductor-on-insulator structure according to the present invention.
Figure 9B:
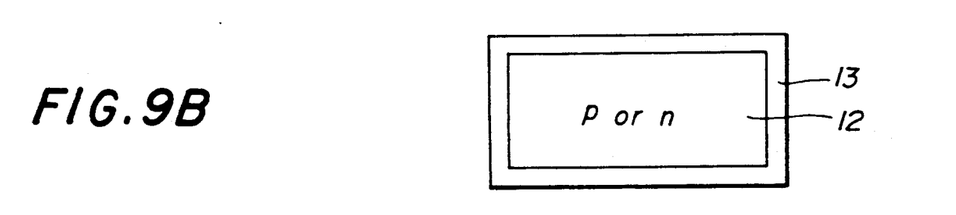

FIG. 9A shows the active substrate 14 which is made of the p-type Si and is covered by the SiO$_2$ layer 15. FIG. 9B shows the base substrate 12 which is made of a p-type or n-type Si and is covered by a SiO$_2$ layer 13. The SiO$_2$ layers 13 and 15 are formed by a thermal oxidation. For example, the SiO$_2$ layer 15 has a thickness in the range of 0.04 micron to 0.1 micron and the SiO$_2$ layer 13 has a thickness in the range of 0.5 micron to 2.0 microns.

Figure 9C:
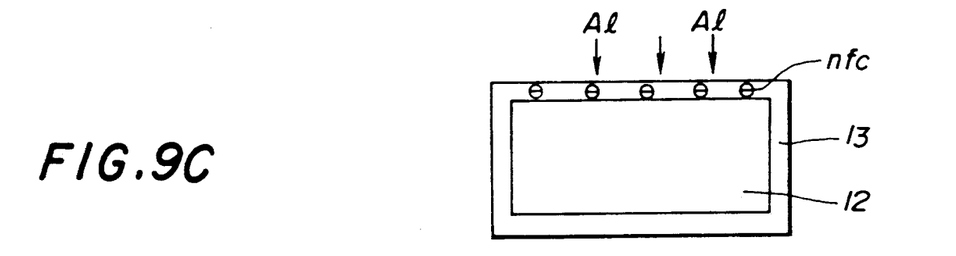
Figure 9D:
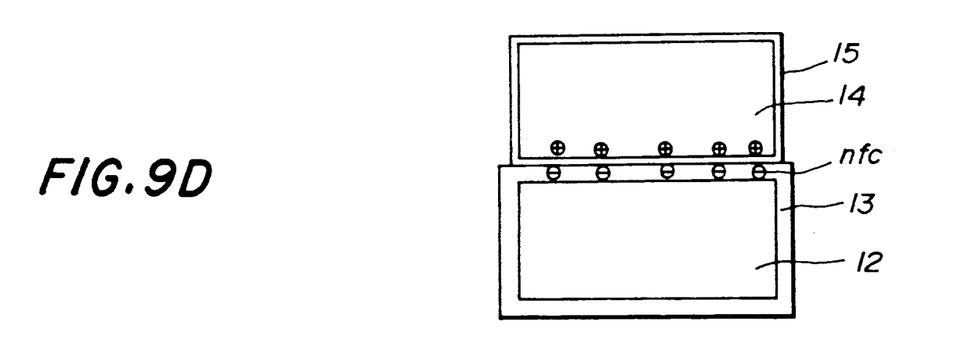
Figure 9E:
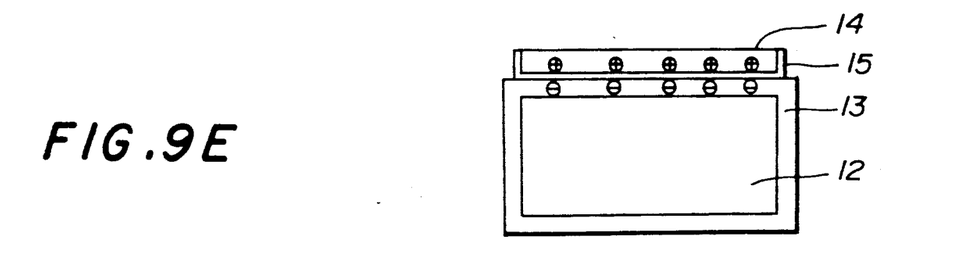

Next, Al ions are injected on one surface of the SiO$_2$ layer 13 as shown in FIG. 9C so as to generate a negative fixed charge nfc within the SiO$_2$ layer 13. The negative fixed charge nfc is generated by a damage and the like within the SiO$_2$ layer 13. The active substrate 14 is then bonded onto the base substrate 12 so that the surface of the SiO$_2$ layer 15 makes contact with the SiO$_2$ layer 13 which has the negative fixed charge nfc as shown in FIG. 9D. The bonding is achieved by applying a field in the state where the SiO$_2$ layer 15 makes contact with the SiO$_2$ layer 13 which has the negative fixed charge nfc, and the SiO$_2$ layers 15 and 13 are bonded by the Van der Waals force. Thereafter, a top portion of the active substrate 14 is removed by a mechanical polishing or a chemical etching as shown in FIG. 9E. For example, the active substrate 14 is formed to a desired thickness which is in the range of 0.1 micron to 10 microns.

Figure 10:
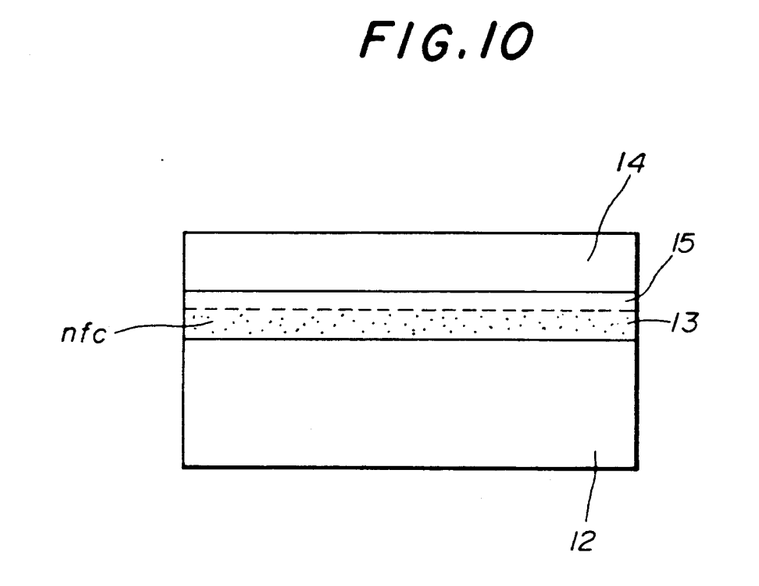
FIG. 10 is a cross sectional view showing the the semiconductor-on-insulator structure which is produced by the second embodiment on an enlarged scale.

FIG. 10 shows a semiconductor-on-insulator structure which is produced by the second embodiment on an enlarged scale. The positive charge is generated in the SiO$_2$ layer 15 due to the SiO and Si$_2$O$_3$ molecules because the Al ions are not injected into the SiO$_2$ layer 15. On the other hand, the negative fixed charge nfc is generated in the SiO$_2$ layer 13 due to the Al ions, and the negative fixed charge nfc cancels the field which is generated by the positive charge within the SiO$_2$ layer 15. In other words, fixed charges of opposite polarities are generated with respect to the interface states of the two SiO$_2$ layers 13 and 15. Therefore, no charge is induced at the interface between the active substrate 14 and the SiO$_2$ layer portion (13 and 15), and it is possible to prevent the inversion and depletion state from occurring at this interface. Because the thickness of the SiO$_2$ layer 15 is small, the field of the fixed charge acting on the active substrate 14 is large.

Figure 11:
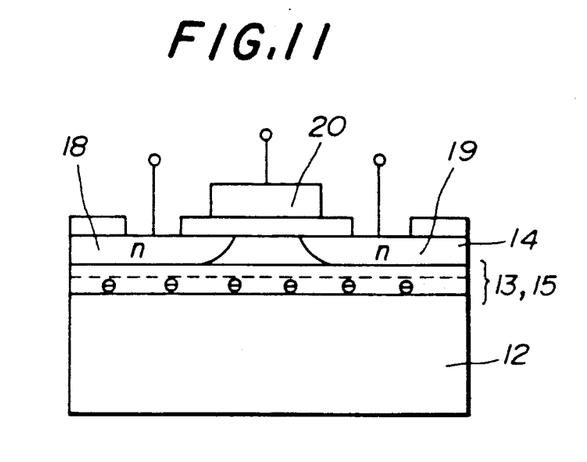
FIG. 11 is a cross sectional view showing a MOSFET which is formed by use of the semiconductor-on-insulator structure shown in FIG. 10.

FIG. 11 shows a MOSFET which is formed by use of the semiconductor-on-insulator structure shown in FIG. 10. The MOSFET has a source 18, a drain 19 and a gate electrode 20. The semiconductor-on-insulator structure prevents the natural generation of an inversion layer and a depletion layer from being formed between the source 18 and the drain 19. Hence, the normal operation of the MOSFET is guaranteed.

Figure 12A:
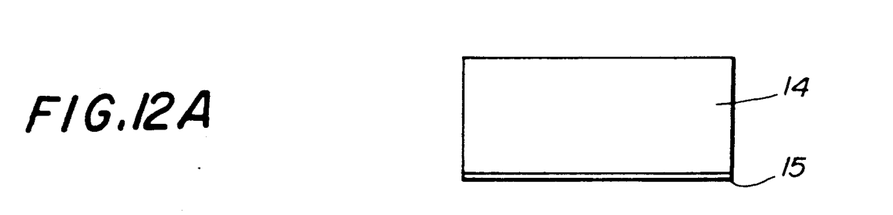
FIGS. 12A through 12C are cross sectional views for explaining a third embodiment of the method of producing a semiconductor-on-insulator structure according to the present invention.
Figure 12B:
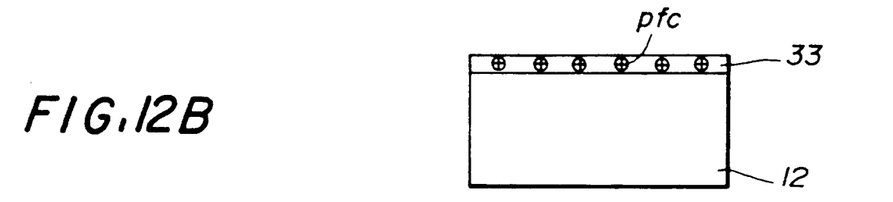
Figure 12C:
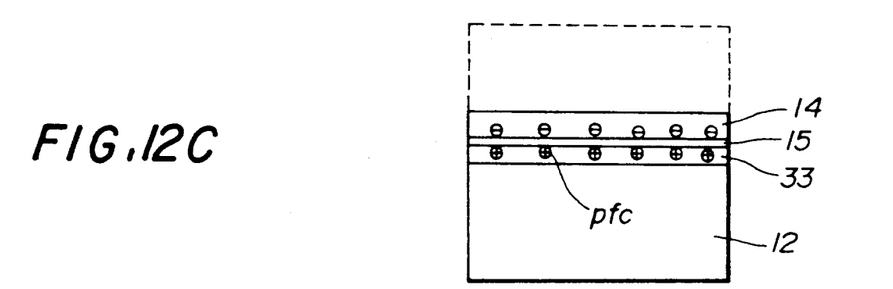

Next, a description will be given of a third embodiment of the method of producing the semiconductor-on-insulator structure according to the present invention, by referring to FIGS. 12A through 12C. In FIGS. 12A through 12C, those parts which are essentially the same as those corresponding parts in FIGS. 9A through 9E are designated by the same reference numerals, and a description thereof will be omitted. FIG. 12A shows the active substrate 14 having the $SiO_2$ layer 15. FIG. 12B shows the base substrate 12 having a glass layer 33 which has a positive fixed charge pfc. For example, the glass layer 33 contains 65 weight percent of zinc oxide (ZnO), 21.5 weight percent of boron dioxide ($BO_2$) and 13.5 weight percent of silicon dioxide ($SiO_2$), and an annealing step is carried out after the glass layer 33 is coated on the base substrate 12. In this embodiment, the glass layer 33 has a thickness of 5000 Å or greater, and the $SiO_2$ layer 15 has a thickness of 500 Å or greater so as to prevent P, B and Zn from diffusing into the active substrate 14 during a thermal process which is carried out in a later stage of the production process.

The substrates 14 and 12 shown in FIGS. 12A and 12B are then subjected to a bonding process to produce the semiconductor-on-insulator structure shown in FIG. 12C. As a result, a negative charge is induced at the interface between the active substrate 14 and the $SiO_2$ layer 15. Hence, it is possible to obtain effects which are substantially the same as those obtainable in the first and second embodiments.

Instead of using the glass layer 33 which has the above described composition, it is possible to use a phospho-silicate glass (PSG) layer which contains 8 weight percent of phosphorous (P). Such a PSG layer may be deposited on the base substrate 12 by a chemical vapor deposition (CVD).

Figure 13:
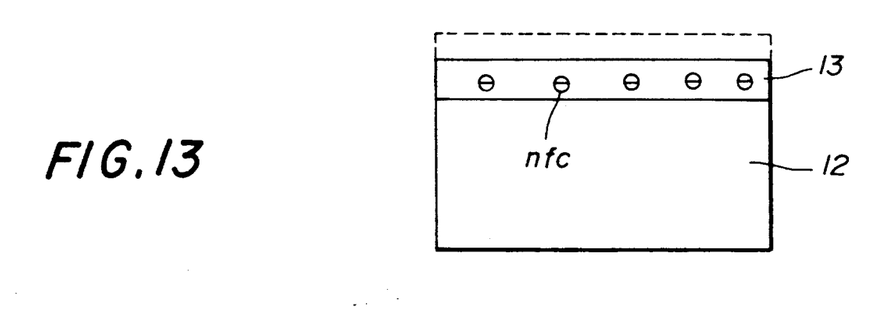
FIG. 13 is a cross sectional view for explaining a modification of the first embodiment of the method of producing an embodiment of the semiconductor-on-insulator structure according to the present invention.

FIG. 13 is a cross sectional view for explaining a modification of the first embodiment of the method of producing an embodiment of the semiconductor-on-insulator structure according to the present invention. In this modification, the $SiO_2$ layer 13 having the negative fixed charge nfc is polished to a predetermined thickness as indicated by a phantom line in FIG. 13 before bonding the substrates 14 and 12. The predetermined thickness is selected so that the Al density at the polished surface of the $SiO_2$ layer 13 is approximately a maximum in FIG. 7. In other words, a certain thickness of the $SiO_2$ layer 13 having the negative fixed charge nfc is removed so that the surface portion contains an Al density corresponding to a peak portion of the depth (distance) versus Al density curve shown in FIG. 7.

Therefore, the embodiment of the semiconductor-on-insulator structure is characterized in that the negative fixed charge is large at the interface between the $SiO_2$ layer 13 and the active substrate 14. Hence, the effect of preventing the back channel is extremely satisfactory.

This modification can be applied similarly to the second embodiment of the method.

In the first and second embodiments of the method, ion implantation is used to inject the Al ions into the $SiO_2$ layer 13. However, it is possible to submerge the base substrate 12 which has the $SiO_2$ layer 13 into a solution including 1000 ppm to 10000 ppm of polyaluminum chloride $[Al_2(OH)_n CL_{6-n}]_m$ so as to generate the negative fixed charge in the $SiO_2$ layer 13, where $1 \leq n \leq 5$ and $m \leq 10$. It is also possible to generate the negative fixed charge by a CVD, an electron cycrotron resonance (ECR) plasma CVD and the like.

In addition, the generation of the negative fixed charge is not limited to injecting Al ions into the $SiO_2$ layer 13. For example, it is possible to inject other elements such as calcium (Ca), potassium (K), tin (Sn) and the like.

Moreover, when the active substrate 14 is made of an n-type semiconductor and negative charge is generated at the interface between the active substrate 14 and the $SiO_2$ layer 15, it is necessary to inject elements into the $SiO_2$ layer 13 of the base substrate 12 so that the positive charge is generated in the $SiO_2$ layer 13 when producing the stacked structure of the base substrate 12 and the $SiO_2$ layer 13.

In addition, the structure to which the active substrate 14 is bonded need not necessarily have the semiconductor/insulator structure. The only requirement is that the base substrate structure has at least an insulator layer, and the entire base substrate structure may be made of an insulator.

The bonding process is of course not limited to the thermal process. For example, it is possible to employ as the bonding method a process which applies an electrostatic pulse to the substrate.

Further, the present invention is not limited to these embodiments, but various variations and modifications may be made without departing from the scope of the present invention.

What is claimed is:

1. A semiconductor-on-insulator structure comprising:
    a base substrate having a main surface;
    an insulator layer at least on the main surface of said base substrate and having a top surface, said insulator layer including impurities therein establishing a first fixed charge in said insulator layer, said impurities having a predetermined density distribution relative to the distance from the top surface of the insulator layer and the top surface of the insulator layer having an impurity density which corresponds approximately to the maximum impurity density in the predetermined density distribution;
    an active substrate of a semiconductor material and having a bottom surface bonded to and defining an interface with the top surface of the insulator layer, said active substrate having a second fixed charge at the interface of the insulator layer and said active substrate, said second fixed charge having a polarity opposite to that of said first fixed charge and a density corresponding to said maximum impurity density of said first charge; and
    at least one semiconductor element formed in a region of said active substrate at least above the first fixed charge of said base substrate.

2. The semiconductor-on-insulator structure as claimed in claim 1 wherein said first fixed charge is negative and said second fixed charge is positive.

3. The semiconductor-on-insulator structure as claimed in claim 1 wherein said insulator layer is made of a material selected from a group which includes silicon dioxide ($SiO_2$), and said impurities are selected from a group of elements including aluminum (Al), calcium (Ca), potassium (K) and tin (Sn).

4. The semiconductor-on-insulator structure as claimed in claim 3 wherein said active substrate is made of a material selected from a group which includes silicon (Si).

5. A semiconductor-on-insulator structure comprising:
- a base structure having a first main surface;
- a first insulator layer at least on the first main surface of said base substrate and having a top surface, said first insulator layer including impurities therein establishing a first fixed charge in said first insulator layer, said impurities having a predetermined density distribution relative to the distance from the top surface of the first insulator layer and the top surface portion of the first insulator layer having an impurity density which corresponds approximately to the maximum impurity density in the predetermined density distribution;
- an active substrate of a semiconductor material having a second main surface;
- a second insulator layer at least on the second main surface of said active substrate and having a bottom surface in contact with, and bonded to and defining an interface with the top surface of the first insulator layer, said active substrate having a second fixed charge at the interface of the second insulator layer and said active substrate, said second fixed charge having a polarity opposite to that of said first fixed charge and a density corresponding to the maximum impurity density of said first fixed charge; and
- at least one semiconductor element formed in a region of said active substrate at least above the first fixed charge of said base substrate.

6. The semiconductor-on-insulator structure as claimed in claim 5 wherein said first fixed charge is positive and said second fixed charge is negative.

7. The semiconductor-on-insulator structure as claimed in claim 5 wherein said first and second insulator layers are made of a material selected from a group which includes silicon dioxide ($SiO_2$), and said impurities are selected from a group of elements including aluminum (Al), calcium (Ca), potassium (K) and tin (Sn).

8. The semiconductor-on-insulator structure as claimed in claim 7 wherein said active substrate is made of a material selected from a group which includes silicon (Si).

* * * * *

UNITED STATES PATENT AND TRADEMARK OFFICE
CERTIFICATE OF CORRECTION

PATENT NO. : 5,066,993

DATED : November 19, 1991

INVENTOR(S) : Miura et al.

It is certified that error appears in the above-identified patent and that said Letters Patent is hereby corrected as shown below:

Title page, item [75], "Komae" should be --Tokyo--.

Signed and Sealed this

First Day of June, 1993

Attest:

MICHAEL K. KIRK

*Attesting Officer*  Acting Commissioner of Patents and Trademarks